United States Patent
Junginger et al.

(10) Patent No.: US 11,968,900 B2
(45) Date of Patent: Apr. 23, 2024

(54) INNOVATIVE AND FLEXIBLE FIXTURE FOR POLING PLAN

(71) Applicant: Xerox Corporation, Norwalk, CT (US)

(72) Inventors: Johann Junginger, Toronto (CA); Simon Burke, Burlington (CA); Sarah Vella, Milton (CA)

(73) Assignee: XEROX CORPORATION, Norwalk, CT (US)

(\*) Notice: Subject to any disclaimer, the term of this patent is extended or adjusted under 35 U.S.C. 154(b) by 652 days.

(21) Appl. No.: 17/109,953

(22) Filed: Dec. 2, 2020

(65) Prior Publication Data
US 2022/0173304 A1  Jun. 2, 2022

(51) Int. Cl.
*H10N 30/04* (2023.01)
*H10N 30/08* (2023.01)
*H01T 19/00* (2006.01)

(52) U.S. Cl.
CPC ............ *H10N 30/04* (2023.02); *H10N 30/08* (2023.02); *H01T 19/00* (2013.01)

(58) Field of Classification Search
CPC ...... H10N 30/04; H10N 30/08; H10N 30/045; H01T 19/00
See application file for complete search history.

(56) References Cited

U.S. PATENT DOCUMENTS

2002/0101246 A1\* 8/2002 Werner, Jr. .......... G01R 15/165
  324/458
2018/0198055 A1\* 7/2018 Zhong .................... H10N 30/88

\* cited by examiner

*Primary Examiner* — Michael C Zarroli
(74) *Attorney, Agent, or Firm* — Lippes Mathias LLP

(57) ABSTRACT

An apparatus 10 for poling piezoelectric material includes a platen 22 which holds a sample 20 of piezoelectric material to be poled and a stage 30 to which the platen is mounted. The stage 30 is arranged to selectively move the platen 22 and thereby the sample 20 which the platen 22 holds. The platen 22 is movable by the stage 30 selectively between a first position and a second position. A corona source 40 generates a corona to which the sample 20 is exposed when the platen 22 is moved to the first position by the stage 30. An electrostatic voltmeter 60 having a probe 62 measures a surface potential of the sample 20 when the platen 22 is moved to the second position by the stage 30.

16 Claims, 3 Drawing Sheets

INNOVATIVE AND FLEXIBLE FIXTURE FOR POLING PLAN

BACKGROUND

The present specification relates to the poling of piezoelectric materials.

Generally, for a piezoelectric material to function as desired, the electric dipoles within a sample material are made to align via a process commonly known as poling. This is typically achieved in one of two ways. In a one approach, a flat sample material is placed between two parallel plate electrodes, submerged in a high dielectric medium, and subjected to very high direct current electric field (e.g. 3 kV/mm). In another approach, the sample material is charged using a process referred to as "corona poling." In conventional corona poling, the sample material is typically placed between a grounded electrode and a wire tip. Corona is generated at the tip of the wire by applying high voltage to the wire. Conventional corona poling is commonly carried out at room temperature.

Prior systems and/or devices for performing corona poling however have been somewhat limited in one way or another. For example, some prior systems did not provide a robust mechanism for monitoring the poling process. Other systems and/or devices where limited to performing corona poling at a nominal room temperature. Additionally, poling using a corona generated at a tip of a wire limits the area of a sample which can be poled at a given time, thereby potentially increasing the time in which it takes to pole an entire sample.

According, there is described herein an inventive method, device and/or system to address the above-identified concerns.

BRIEF DESCRIPTION

This Brief Description is provided to introduce concepts related to the present specification. It is not intended to identify essential features of the claimed subject matter nor is it intended for use in determining or limiting the scope of the claimed subject matter. The exemplary embodiments described below are not intended to be exhaustive or to limit the claims to the precise forms disclosed in the following Detailed Description. Rather, the embodiments are chosen and described so that others skilled in the art may appreciate and understand the principles and practices of the subject matter presented herein.

One embodiment disclosed herein provides an apparatus for poling a piezoelectric material, which includes a platen that holds a sample of piezoelectric material to be poled and a stage to which the platen is mounted. The stage is arranged to selectively move the platen and thereby the sample which the platen holds. The platen is movable by the stage selectively between a first position and a second position. A corona source generates a corona to which the sample is exposed when the platen is moved to the first position by the stage. An electrostatic voltmeter having a probe measures a surface potential of the sample when the platen is moved to the second position by the stage.

Another embodiment disclosed herein relates to a method for poling piezoelectric material. The method includes: mounting a sample of piezoelectric material on a platen; moving the platen so as to locate the sample in a first position proximate to a corona source; exposing the sample to a corona generated by the corona source; moving the platen so as to locate the corona exposed sample in a second position proximate to a probe of an electrostatic voltmeter; and measuring a surface potential of the corona exposed sample with the electrostatic voltmeter.

Numerous advantages and benefits of the subject matter disclosed herein will become apparent to those of ordinary skill in the art upon reading and understanding the present specification. It is to be understood, however, that the detailed description of the various embodiments and specific examples, while indicating preferred and/or other embodiments, are given by way of illustration and not limitation.

BRIEF DESCRIPTION OF THE DRAWINGS

The following Detailed Description makes reference to the figures in the accompanying drawings. However, the inventive subject matter disclosed herein may take form in various components and arrangements of components, and in various steps and arrangements of steps. The drawings are only for purposes of illustrating exemplary and/or preferred embodiments and are not to be construed as limiting. Further, it is to be appreciated that the drawings may not be to scale.

DETAILED DESCRIPTION

For clarity and simplicity, the present specification shall refer to structural and/or functional elements, relevant standards, algorithms and/or protocols, and other components, methods and/or processes that are commonly known in the art without further detailed explanation as to their configuration or operation except to the extent they have been modified or altered in accordance with and/or to accommodate the preferred and/or other embodiment(s) presented herein. Moreover, the apparatuses and methods disclosed in the present specification are described in detail by way of examples and with reference to the figures. Unless otherwise specified, like numbers in the figures indicate references to the same, similar or corresponding elements throughout the figures. It will be appreciated that modifications to disclosed and described examples, arrangements, configurations, components, elements, apparatuses, methods, materials, etc. can be made and may be desired for a specific application. In this disclosure, any identification of specific materials, techniques, arrangements, etc. are either related to a specific example presented or are merely a general description of such a material, technique, arrangement, etc. Identifications of specific details or examples are not intended to be, and should not be, construed as mandatory or limiting unless specifically designated as such. Selected examples of apparatuses and methods are hereinafter disclosed and described in detail with reference made to the figures.

Figure 1:
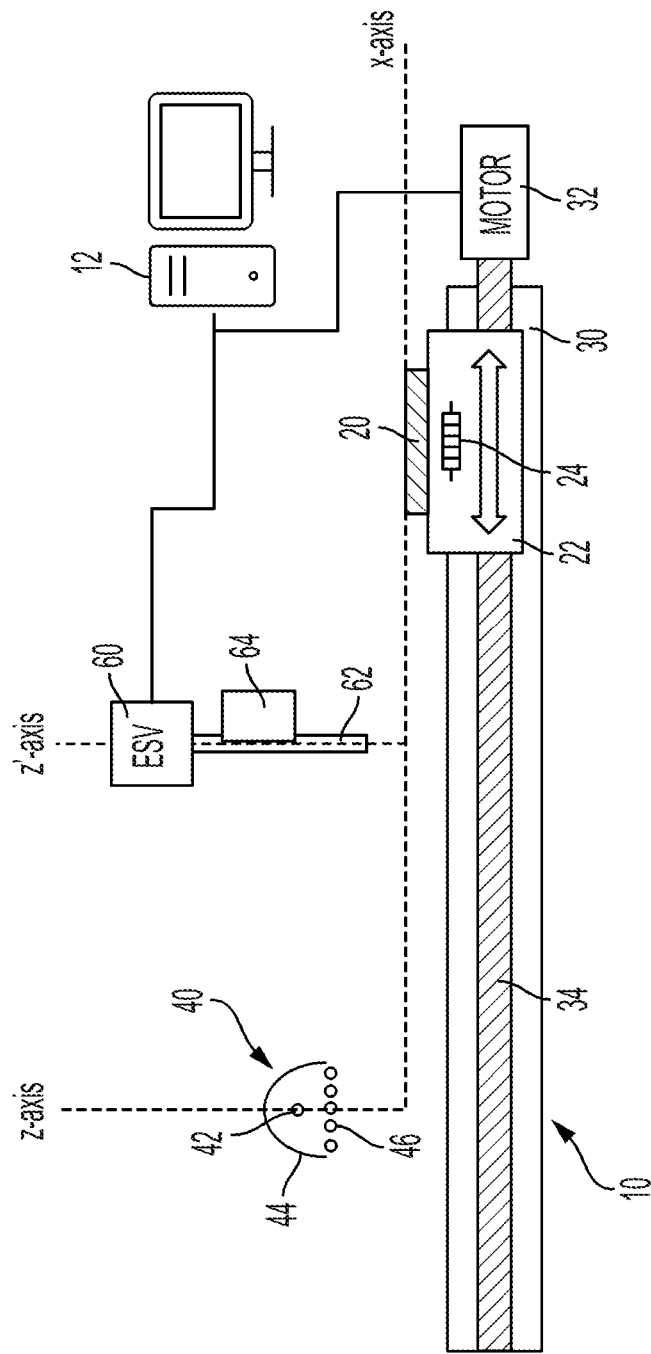
FIG. 1 is a diagrammatic illustration showing a side view of an exemplary system and/or device for poling piezoelectric materials in accordance with aspects of the present inventive subject matter.
Figure 2:
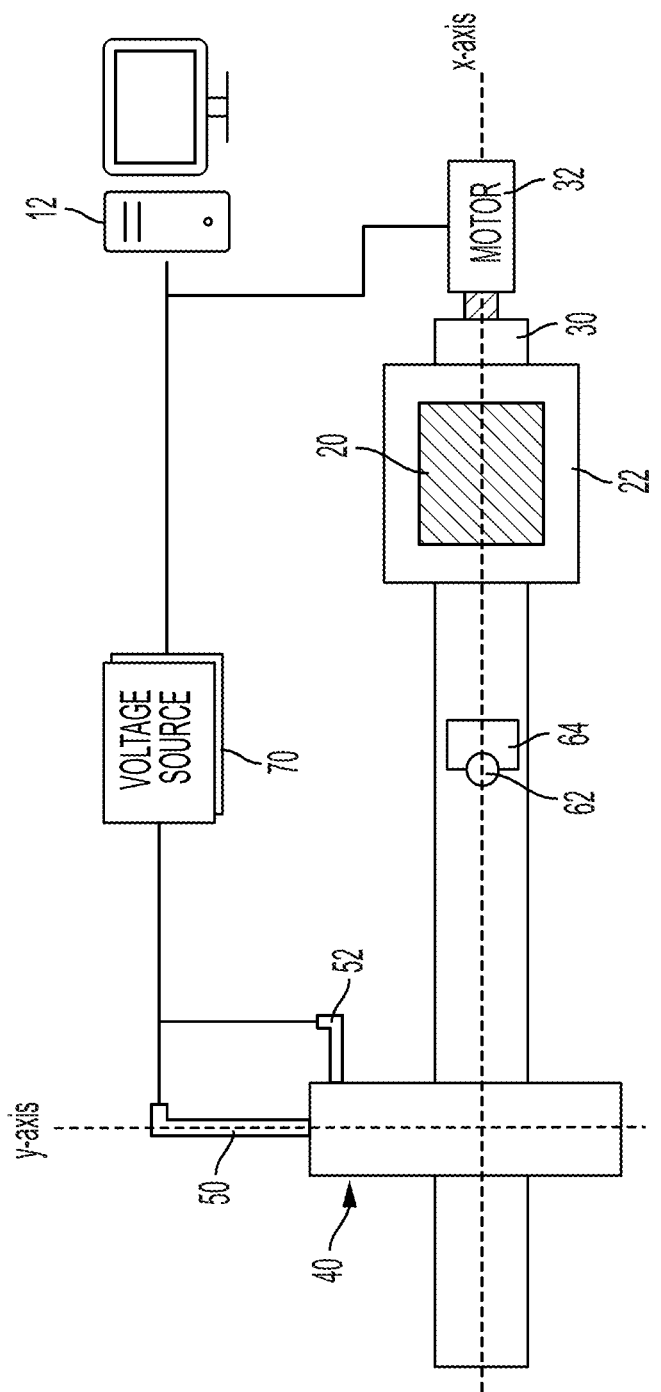
FIG. 2 is a diagrammatic illustration showing a top view of the exemplary system and/or device shown in FIG. 1.

With reference to FIGS. 1 and 2, there is illustrated an exemplary system and/or device 10 for poling piezoelectric materials. Suitably, the poling system/device 10 and/or selected components thereof are controlled and/or regulated by a computer 12. In practice, the poling system/device 10 may be contained in a protective housing (not shown). Suitably, the housing contains undesirable and/or potentially harmful gasses produced as a by-product of the poling process and/or corona generation from escaping uncontrolled into the surrounding environment. These gasses may be suitably vented from the housing through an appropriate filter, e.g., such as a charcoal filter.

As shown, the piezoelectric material to be poled, i.e., sample 20, is securely mounted to and/or held by a platen 22. For example, the platen 22 may be perforated and/or have holes or the like formed therein and a vacuum chuck or the like is used to hold the sample 20 on the platen 22. Optionally, the platen 22 is provisioned with a heating element 24 that is selectively energized and/or otherwise operated to heat the sample 20 held by the platen 22 to a desired temperature e, e.g., significantly above an otherwise ambient temperature of the surrounding environment. Suitably, the sample 20 may be any appropriate piezoelectric material, e.g., crystalline materials, ceramics, semiconductors, polymers, polymer composites, etc.

In one exemplary embodiment, the platen 22 is thermally and/or electrically conductive. A thermally conductive platen 22 permits efficient heating of the sample 20 by suitably conducting heat thereto from the heating element 24. An electrically conductive platen 22 permits the platen 22 to act as a ground plate for a corona source 40 and/or an electrostatic voltmeter (ESV) 60 as described later herein.

In the illustrated example, the platen 22 is mounted on a linear stage 30 so that the platen 22 mounted thereto (along with the sample 20 held by the platen 22) is selectively translatable and/or movable along the direction of an axis in a plane, which axis shall be nominally referred to herein as the x-axis and which plane shall be nominally referred to herein as the x-y plane. Suitably, however, the stage 30 maybe a multi-axis stage providing multiple degrees of freedom for the platen 22 to be translated and/or otherwise moved in any arbitrary direction within the x-y plane and/or along the directions of multiple specified axes within the x-y-plane. Suitably, the stage 30 is optionally motorized and/or computer controlled and may move the platen 22 so as to locate the platen 22 in any position along a continuum within the range of motion of the stage 30. As shown, a motor 32 is operatively connected to the platen 22 via a suitable mechanical linkage 34 (e.g., such as a threaded drive shaft) to move the platen 22 as desired. In practice, the computer 12 may optionally control the motor 32 to achieve the desired movement of the platen 22 and the sample 20 carried thereby. Additionally, the computer 12 may control and/or regulate operation of the heating element 24 to achieve a selected or desired heating of the sample 20.

As shown, a corona source 40 is arranged at a distance from the x-y-plane on an axis which intersects to the x-y plane. This axis is nominally referred to herein as the z-axis and it is suitably normal to the x-y plane. In one exemplary embodiment, the corona source 40 is movable along the z-axis so that it may be selectively position there-along in order to reside at a selected distance from the sample 20 when the sample 20 is aligned with and/or otherwise positioned proximate to the corona source 40, e.g., by appropriate operation of the stage 30. In one suitable embodiment, the corona source 40 is selectively movable so as to be selectively spaced at a distance of approximately 0 mm to approximately 250 mm from the sample 20 in the direction of the z-axis. In suitable embodiments, the corona source 40 is implemented as a corotron or screened corotron (i.e., scorotron).

As shown, the corona source 40 is a scorotron, including a corona wire 42 extending (e.g., in a direction of what is nominally referred to herein as a y-axis which is suitably substantially normal to the x-axis) within a shield 44 and behind a wire screen 46. A first high voltage cable or wire 50 selectively supplies and/or applies a selected voltage (e.g., in the kilovolt (kV) range) to the corona wire 42 of the scorotron and a second high voltage cable or wire 52 selectively supplies and/or applies a selected voltage to the wire screen 46 of the scorotron. The cables/wires 50 and 52 are operatively connected to one or more selectively variable voltage sources 70 that are selectively controlled and/or regulated (e.g., via the computer 12) to provide a suitable voltage to the corona wire 42 and/or screen 46 as desired.

As shown, a probe 62 of an electrostatic voltmeter (ESV) 60 is arranged and held by a mount 64 at a distance from the x-y-plane on an axis which intersects to the x-y plane. This axis is nominally referred to herein as the z'-axis and it is suitably normal to the x-y plane. In practice, the z'-axis may be substantially parallel to the z-axis and spaced some distance therefrom in a direction of the x-axis. In one exemplary embodiment, the probe 62 is movable along the z'-axis so that is may be selectively positioned there-along in order to reside at a selected distance from the sample 20 when the sample 20 is aligned with and/or otherwise positioned proximate to the ESV probe 62, e.g., by appropriate operation of the stage 30. In one suitable embodiment, the probe 62 of the ESV 60 is selectively movable so as to be selectively spaced at a distance of approximately 1 mm to approximately 3 mm from a surface of the sample 20 in the direction of the z'-axis. Suitably, the mount 64 is electrically insulating.

In practice, the ESV 60 accurately measures a surface potential (or voltage) on the sample 20 without making physical contact therewith and so there is no electrostatic charge transfer from or loading on the sample 20. As shown, measurements and/or data taken and/or collected by the ESV 60 are fed or otherwise provided to the computer 12 which selectively regulates and/or controls the poling system/device 10 in response thereto.

Figure 3:
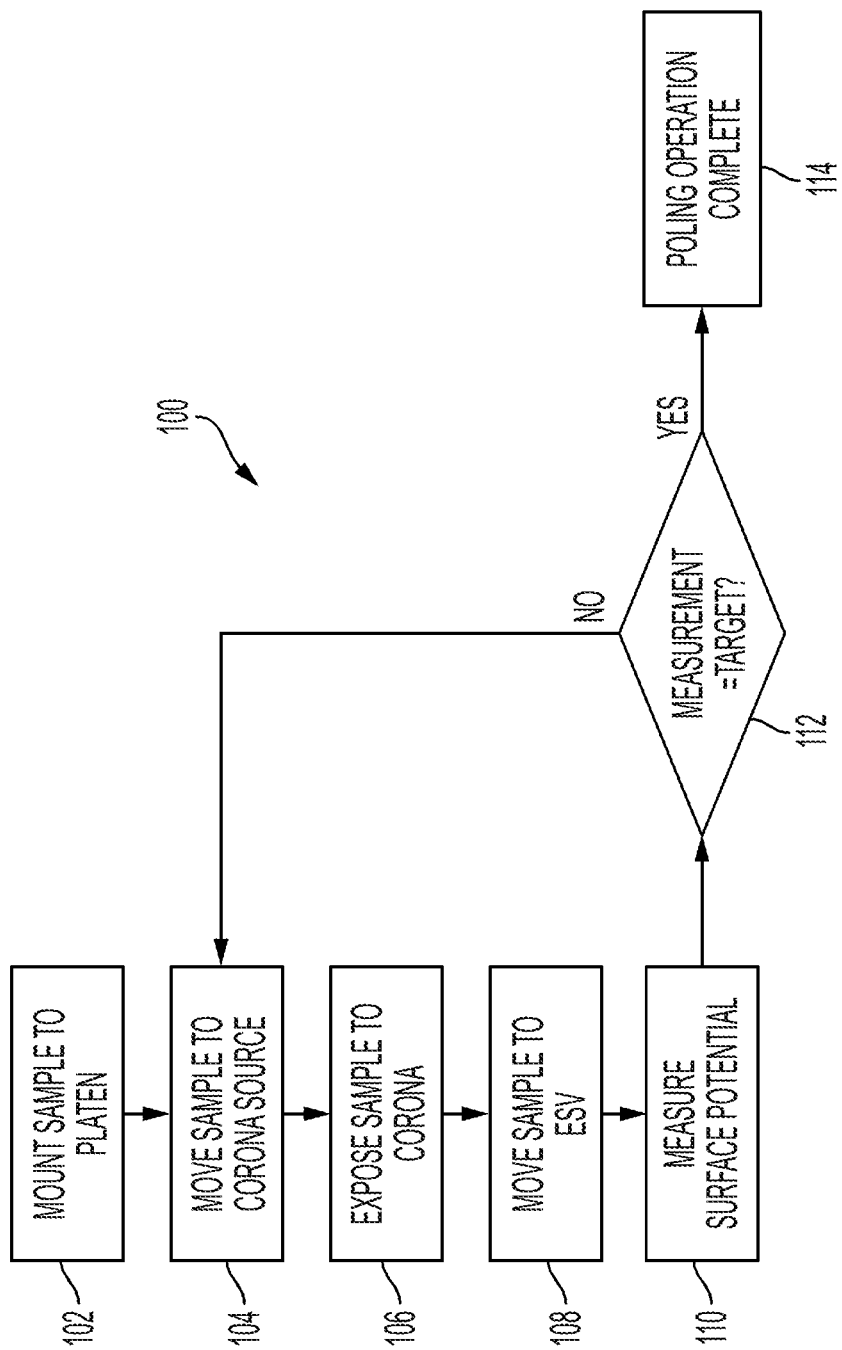
FIG. 3 is a flow chart showing an exemplary poling operation carried out using the exemplary system and/or device shown in FIGS. 1 and 2.

With added reference now to FIG. 3, an exemplary poling operation 100 employing the poling system/device 10 is now described.

Initially, at step 102, the sample 20 is mounted to the platen 22. Optionally, under control of the computer 12, the heating element 24 is operated to heat the sample 20 to a selected temperature.

At step 104, the sample 20 is moved under or otherwise proximate to a corona source 40, e.g., via suitable operation of the stage 30 as controlled by the computer 12.

At step 106, under the control of the computer 12, the corona wire 42 and/or screen 46 are supplied a voltage, e.g., from voltage source(s) 70 to generate the desired corona to which the sample 20 is exposed for a selected exposure time, e.g., approximately 1 hour to approximately 2 hours. Suitably, in practice, the exposure time may optionally be more or less than the foregoing range.

At step 108, after the desired exposure, the sample is moved under or otherwise proximate the probe 62 of the ESV 60, e.g., via suitable operation of the stage 30 as controlled by the computer 12.

At step 110, the ESV 60 measures a surface potential or surface charge acquired by the sample 20, e.g., due to the corona exposure.

Optionally, as shown in FIG. 3, the measured value obtained by the ESV 60 is fed to the computer 12 which compares it to a target value, and at decision step 112, if the measured value is substantially equal to the target value (e.g., within a set or selected tolerance), then the poling operation 100 ends at step 114. Otherwise, under the control of the computer 12, the operation 100 continues with the sample 20 being returned to the corona source 40 for additional corona exposure.

Suitably, the computer 12 may also employ one or more obtained measurements from the ESV 60 to determine the piezoelectric and/or other properties of the corona treated sample 20. For example, measurements from the ESV 60 are optionally used to calculate or otherwise determine the electric field through the treated sample 20 and/or the piezoelectric charge coefficients or piezoelectric modulus (i.e., the $d_{33}$, $d_{31}$, $d_{15}$ etc.) of the treated sample 20.

Significantly, the computer 12 may be programmed to execute a poling operation employing the system/device 10 with any of a selective set of variable/adjustable operational parameters. For example, the corona exposure time may be selectively adjustable, the voltages applied to the corona wire 42 and/or screen 44 may be selectively adjustable, etc. Moreover, the sample 20 can be readily cycled at regular or otherwise selected intervals between a first position for taking measurements with the ESV 60 and a second position for exposing the sample 20 to the corona generated by the corona source 40. In this way, the system/device 10 can ensure an efficient corona treatment of the sample 20 which precisely achieves the desired surface potential. Additionally, the use of a corotron and/or scorotron as the corona source 40, as compared to a wire tip, allows a greater area of the sample 20 to be corona treated at one time, thereby decreasing the overall time it takes to complete the poling of the sample 20. Moreover, the corotron and/or scorotron can generally provide more uniformity in corona exposure to the sample 20 as compared to a wire tip generated corona treatment.

The above methods, system, platforms, modules, processes, algorithms and/or apparatus have been described with respect to particular embodiments. It is to be appreciated, however, that certain modifications and/or alteration are also contemplated.

It is to be appreciated that in connection with the particular exemplary embodiment(s) presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that any one or more of the particular tasks, steps, processes, methods, functions, elements and/or components described herein may suitably be implemented via hardware, software, firmware or a combination thereof. In particular, various modules, components and/or elements may be embodied by processors, electrical circuits, computers and/or other electronic data processing devices that are configured and/or otherwise provisioned to perform one or more of the tasks, steps, processes, methods and/or functions described herein. For example, a processor, computer or other electronic data processing device embodying a particular element may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

Optionally, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that all such modifications and alterations are included herein insofar as they come within the scope of the appended claims or the equivalents thereof. It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. An apparatus for poling a piezoelectric material, said apparatus comprising:
 a platen which holds a sample of piezoelectric material to be poled;

a stage to which the platen is mounted, said stage being arranged to selectively move the platen and thereby the sample which the platen holds, said platen being movable by the stage selectively between a first position and a second position;

a corona source that generates a corona to which the sample is exposed when the platen is moved to the first position by the stage;

an electrostatic voltmeter having a probe, said electrostatic voltmeter measuring a surface potential of the sample when the platen is moved to the second position by the stage; and a computer which compares the measured surface potential to a target value and, based on said comparing, if the measured surface potential is not the same as the target value, to within a set tolerance, controls movement of the platen so as to return the sample to the first position proximate the corona source for re-exposing the sample to the corona generated by the corona source.

2. The apparatus of claim 1, further comprising:
a heating element mounted to the platen, said heating element being selectively controlled to heat the sample while the sample is being held by the platen.

3. The apparatus of claim 1, further comprising:
a motor; and
a mechanical linkage operatively connecting the motor to the platen so that the platen is moved by the stage in accordance with an operation of the motor.

4. The apparatus of claim 3, wherein the operation of the motor is controlled by a computer.

5. The apparatus of claim 1, wherein the corona source is one of a corotron or a scorotron.

6. The apparatus of claim 5, wherein the corona source is a scorotron including a wire and a screen and the apparatus further comprises:
a first voltage source that applies a first variably controllable voltage to the wire; and
a second voltage source that applies a second variably controllable voltage to the screen.

7. The apparatus of claim 1, wherein the platen is at least one of electrically conductive and thermally conductive.

8. The apparatus of claim 1, wherein the platen is movable by the stage so as to be selectively located at any of a plurality of positions along a continuum between the first position and the second position.

9. A method for poling piezoelectric material, said method comprising:
mounting a sample of piezoelectric material on a platen;
moving the platen so as to locate the sample in a first position proximate to a corona source;
exposing the sample to a corona generated by the corona source;
moving the platen so as to locate the corona exposed sample in a second position proximate to a probe of an electrostatic voltmeter;
measuring a surface potential of the corona exposed sample with the electrostatic voltmeter;
comparing the measured surface potential to a target value; and
based on said comparing, if the measured surface potential is not the same as the target value, to within a set tolerance, moving the platen so as to return the sample to the first position proximate the corona source and re-exposing the sample to the corona generated by the corona source.

10. The method of claim 9, further comprising:
heating the sample mounted to the platen.

11. The method of claim 9, wherein the corona source is one of a corotron or a scorotron.

12. The method of claim 9, wherein the platen is at least one of electrically conductive and thermally conductive.

13. The method of claim 9, further comprising:
operating a motor connected to the platen by a mechanical linkage to cause said moving of the platen.

14. The method of claim 13, wherein said operating of the motor is controlled by a computer.

15. The method of claim 9, further comprising:
determining from the measured surface potential at least one of an electric field through the corona exposed sample and a piezoelectric coefficient of the corona exposed sample.

16. An apparatus for poling a piezoelectric material, said apparatus comprising:
a platen which holds a sample of piezoelectric material to be poled;
a stage to which the platen is mounted, said stage being arranged to selectively move the platen and thereby the sample which the platen holds, said platen being movable by the stage selectively between a first position and a second position;
a corona source that generates a corona to which the sample is exposed when the platen is moved to the first position by the stage; and
an electrostatic voltmeter having a probe, said electrostatic voltmeter measuring a surface potential of the sample when the platen is moved to the second position by the stage, the probe being selectively movable so as to be spaced at a selected distance from a surface of the sample.

* * * * *